United States Patent [19]

Sandhu et al.

[11] Patent Number: 5,335,138
[45] Date of Patent: Aug. 2, 1994

[54] HIGH DIELECTRIC CONSTANT CAPACITOR AND METHOD OF MANUFACTURE

[75] Inventors: Gurtej Sandhu; Pierre Fazan, both of Boise, Id.

[73] Assignee: Micron Semiconductor, Inc., Bois, Id.

[21] Appl. No.: 17,385

[22] Filed: Feb. 12, 1993

[51] Int. Cl.⁵ ............... H01G 1/01; H01L 27/00
[52] U.S. Cl. .................. 361/303; 361/311; 361/321.1; 257/306; 257/310; 437/60
[58] Field of Search ............ 361/301.4, 303, 311, 361/313, 320, 321.1, 322; 437/47, 52, 60; 257/68, 71, 300, 303, 306, 310, 532, 534, 535, 296, 309; 427/79

[56] References Cited

U.S. PATENT DOCUMENTS

| | | | |
|---|---|---|---|
| 4,760,034 | 7/1988 | Barden | 437/47 |
| 4,761,678 | 8/1988 | Goto | 257/296 |
| 4,849,369 | 7/1989 | Jeuch et al. | 437/52 |
| 4,903,110 | 2/1990 | Aono | 361/313 |
| 5,053,917 | 10/1991 | Miyasaka et al. | 361/321 |
| 5,070,026 | 12/1991 | Greenwald et al. | 437/52 |
| 5,075,817 | 12/1991 | Butler | 361/313 |
| 5,077,232 | 12/1991 | Kim et al. | 437/52 |
| 5,081,559 | 1/1992 | Fazan et al. | 361/313 |
| 5,130,267 | 7/1992 | Kaya et al. | 437/60 |
| 5,134,086 | 7/1992 | Ahn | 437/52 |
| 5,198,384 | 3/1993 | Dennison | 437/52 |

OTHER PUBLICATIONS

Koyama et al., "A Stacked Capacitor With (Ba$_x$Sr$_{1-x}$)-TiO$_3$ For 256M DRAM", IEDM 91-823.

*Primary Examiner*—Bruce A. Reynolds
*Assistant Examiner*—Gregory L. Mills
*Attorney, Agent, or Firm*—Stephen A. Gratton

[57] ABSTRACT

A high storage capacity capacitor for a semiconductor structure includes a barrier layer formed on a polysilicon electrode, a lower electrode, a dielectric layer, and an upper electrode. The dielectric material is formed of a high dielectric constant material such as BaSrTiO$_3$. In order to protect the barrier layer from oxidation during deposition of the dielectric layer and to provide a smooth surface geometry for depositing the dielectric layer, conducting or insulating spacers are formed on the sidewalls of the barrier layer and lower electrode. A smooth dielectric layer can thus be formed that is less susceptible to current leakage. In addition, the insulating spacers can be formed to completely fill a space between adjacent capacitors and to provide a completely planar surface.

14 Claims, 1 Drawing Sheet

HIGH DIELECTRIC CONSTANT CAPACITOR AND METHOD OF MANUFACTURE

FIELD OF THE INVENTION

This invention relates to semiconductor manufacture and more particularly to a novel high dielectric constant capacitor and a method for manufacturing such a capacitor. The improved capacitor includes a fully covered barrier layer for a lower electrode and smooth dielectric layer to eliminate current leakage.

BACKGROUND OF THE INVENTION

Advancements in semiconductor manufacture have led to increases in the density and miniaturization of microelectronic circuits. As an example, the manufacture of 16 Mb DRAMs is now possible and 64 Mb and 256 Mb prototypes are currently being developed. A key requirement for achieving such high device packing density is the formation of suitable storage capacitors.

With the increased packing density of memory cells, however, the area available for storage capacitors (i.e storage nodes) has decreased. This has necessitated the development of storage capacitors having an increased capacitance. In general, storage capacitors can be formed as stacked structures or as trench structures. The present invention is concerned with stacked capacitors having a high storage capacity.

Typically a thin film stacked storage capacitor includes a lower electrode, an upper electrode, and a dielectric layer which is sandwiched between the electrodes. This capacitor structure is stacked on an insulating layer of a substrate. The insulating layer may be formed of insulating materials such as $SiO_2$ and $Si_3N_4$ that are compatible with a silicon process. The lower electrode of the capacitor is connected to an FET transistor formed on the substrate. In the past, a polycrystalline silicon layer has been used as the lower electrode of a capacitor. Such a polysilicon layer is sometimes referred to as a polysilicon (or silicon) electrode.

One way for increasing the capacity of this type capacitor is to use a dielectric layer formed with a high dielectric constant material. These high dielectric constant materials include inorganic non-metallic oxides in the paraelectric or ferroelectric phase such as $BaSrTiO_3$ (BST), $BaTiO_3$, $SrTiO_3$, $PbZrO_3$ and others. (Better insulating inorganic metal oxides are sometimes also used). Such high dielectric constant materials have a dielectric constant larger than 100. This is an order of magnitude larger than traditional dielectric materials, such as $SiO_2$ and $Si_3N_4$, which have dielectric constants of less than 10.

A problem with this type of high capacity capacitor is that in general, high dielectric constant films cannot be formed directly over a polysilicon electrode. This is because an interface layer of silicon dioxide forms between the dielectric film and the polysilicon electrode. Such an interface layer reduces the effective dielectric constant the dielectric material and defeats its purpose. For this reason the lower electrode structure is typically formed as a stack comprising a barrier layer formed on the polysilicon electrode and then the lower electrode formed on the barrier layer.

The barrier layer is typically formed of a conductive material such as tantalum (Ta) or titanium nitride (TiN). Such a barrier layer in addition to preventing oxidation of the polysilicon electrode also functions to prevent silicon diffusion into the lower electrode. Such silicon diffusion would increase the resistivity of the lower electrode and could lead to the formation of a thin $SiO_2$ layer on top of the lower electrode.

Another problem associated with the use of high dielectric constant films is that these films must be deposited at relatively high temperature (i.e. 600°-700° C.). Because of the high process temperatures that are required, the lower electrode of such a capacitor is typically formed of a high melting point, non-oxidizing metal such as platinum, palladium or rhodium or of a conducting oxide such as ruthenuim oxide, iridium oxide, osmium oxide or rhodium oxide. A non-oxidizing material is required for the lower electrode because a traditional electrode material such as aluminum, titanium, nichrome or copper will oxidize at the high temperatures increasing the resistivity of the electrode.

One such improved high capacitance capacitor is described in the technical article entitled "A Stacked Capacitor With $(Ba_xSr_{1-x})Tio_3$ For 256M DRAM") by Koyama et al. in IEDM 91-823 at pgs. 32.1–4. Such a stacked capacitor is shown in FIG. 1 and generally designated as 10. A memory array includes many of these capacitors arranged in a matrix.

With reference to FIG. 1, a semiconductor substrate 12 includes an FET transistor (not shown) formed with a pair of insulated gate electrodes 14, 16. An insulating layer 18 (i.e. $SiO_2$) is formed over the FET transistor and gate electrodes 14, 16. The capacitor 10 is stacked on this insulating layer 18. A polysilicon plug 20 (or polysilicon electrode) is formed in a contact hole placed through the insulating layer 18 to the source or drain region 30 of the FET transistor.

The capacitor 10 includes a lower electrode 22, an upper electrode 24, and a dielectric film 26 formed between the lower electrode 22 and the upper electrode 24. The dielectric film 26 comprises a nigh dielectric constant material such as $BaSrTiO_3$. The capacitor 10 also includes a barrier layer 28 formed between the lower electrode 22 and the polysilicon plug 20. The barrier layer 28 is preferably formed of a conducting material, such as Ta or TiN.

As previously explained, the barrier layer 28 is required to prevent the oxidation of the polysilicon plug 20 and the formation of an interfacial oxide. In addition, the barrier layer 28 prevents the reaction of the lower electrode 22 with the polysilicon plug 20.

Such a stacked capacitor represents the state of the art for high capacitance stacked capacitors. This capacitor structure, however, is subject to several limitations.

A first limitation is that the dielectric layer 26 must be formed over the stepped or non-planar surface contour provided by the stack formed by the lower electrode 22 and barrier layer 28. Poor step coverage of the dielectric material 26 over the lower electrode 22 promotes charge leakage at the corners 32, 33 of the dielectric material 26 in the completed capacitor structure. For this reason an insulating material such as $SiO_2$ is sometimes deposited over the outside corners of the dielectric film 26.

Another limitation of this type of high capacity capacitor 10 is that the sidewalls 34, 36 of the barrier layer 28 are exposed to oxidation during deposition of the dielectric film 26. Accordingly, the high temperatures encountered during the dielectric deposition process will cause the sidewalls of the barrier layer 28 to oxidize. Such an oxide will increase the contact resistance of the barrier layer 28. In addition, with an oxide formed on the sidewalls 34, 36 of the barrier layer 28, the lower electrode 22 will not adhere as well to the barrier layer 28. This may cause the lower electrode 22 to lift off and separate from the barrier layer 28.

Finally, if the barrier layer 28 does not completely overlap the polysilicon plug 20, then the surface of the polysilicon plug 20 will oxidize during deposition of the dielectric material 26. A critical alignment of the barrier layer 28 with the polysilicon plug 20 is thus required.

In view of these problems, there is a need in the art for a stacked capacitor structure which is not subject to these limitations. Accordingly, it is an object of the present invention to provide an improved high dielectric constant capacitor and a method for manufacturing such a capacitor. It is a further object of the present invention to provide a high dielectric constant capacitor in which a dielectric layer is formed with a smooth geometry so that current leakage from the dielectric layer is minimized. It is a further object of the present invention to provide a high dielectric constant capacitor in which a barrier layer of the capacitor is protected from oxidation during manufacture. It is yet another object of the present in invention to provide a high dielectric constant capacitor which a polysilicon electrode for the capacitor is protected from oxidation during manufacture. Finally, it is an object of the present invention to provide a method for forming a high dielectric constant capacitor that is adaptable to large scale semiconductor manufacture.

SUMMARY OF THE INVENTION

In accordance with the present invention, a high dielectric constant capacitor and method of manufacturing such a capacitor are provided. The capacitor of the invention is adapted for use as a stacked storage capacitor for a DRAM cell. Typically such a capacitor will be formed on a polysilicon electrode connected to a cell access transistor.

A capacitor constructed in accordance with the invention includes; a barrier layer, a lower electrode, a dielectric material, and an upper electrode. In addition, the capacitor includes spacers which cover the sidewalls of the barrier layer and the corners of the lower electrode. The spacers protect the sidewalls of the barrier layer from oxidation during deposition of the dielectric layer. In addition, the spacers provide a smooth surface for deposition of the dielectric layer so that it can be formed without sharp corners. A smooth dielectric geometry helps to minimize current leakage from the dielectric layer.

The spacers may be formed with a rounded or planar surface using a spacer etch step or with a planar surface top using a chemical mechanical planarization (CMP) step. In addition, the spacers may be formed to completely fill the gap between adjacent capacitors of a memory array.

A method of forming a capacitor in accordance with the invention includes the steps of; forming an insulating layer on a semiconductor transistor structure; forming a polysilicon electrode (i.e. polysilicon plug) through the insulating layer to the transistor; forming a barrier layer in contact with the polysilicon electrode; forming a lower electrode over the barrier layer; forming spacers by etching or chemical mechanical planarization (CMP) to cover the sidewalls of the barrier layer and the corners of the lower electrode and to provide a smooth surface for deposition of a dielectric layer; depositing a high dielectric constant dielectric layer on the lower electrode and spacers; and forming an upper electrode on the dielectric layer.

Other objects, advantages and capabilities of the present invention will become more apparent as the description proceeds.

DETAILED DESCRIPTION OF THE PREFERRED EMBODIMENT

Figure 2:
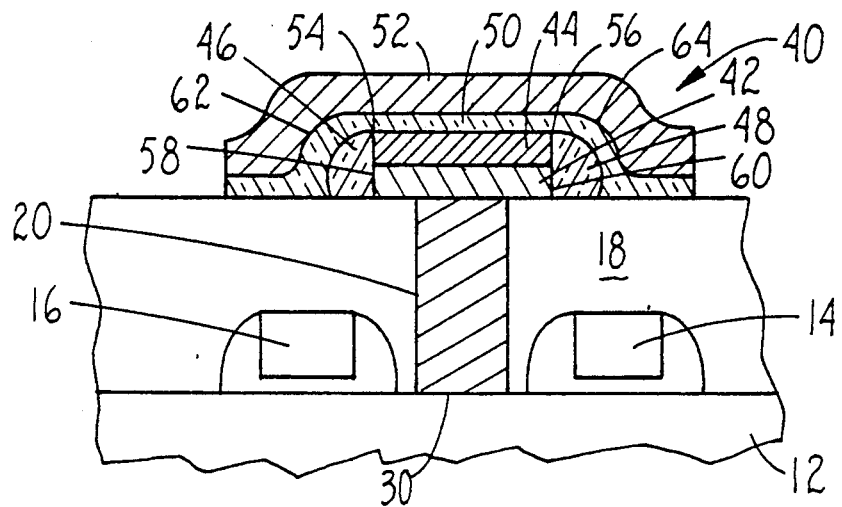
FIG. 2 is a schematic cross sectional view of a thin film high dielectric constant capacitor constructed in accordance with the invention and having rounded spacers formed by a spacer etch step.

Referring now to FIG. 2, a capacitor constructed in accordance with the invention is shown and generally designated as 40. As with the prior are capacitor 10, the capacitor 40 is formed on a semiconducting substrate 12 on which a field effect transistor (FET) (not shown) of a DRAM cell has been formed. The FET transistor includes an insulating layer 18 and gate electrodes 14, 16 formed in the insulating layer 18.

A conductive polysilicon plug 20 is formed in a contact hole placed through the insulating layer 18 to the low resistance silicon source or drain region 30 of the FET transistor. The polysilicon plug 20 may be formed by technologies that are well known in the art. Such a polysilicon plug 20 can also be termed a polysilicon electrode or simply a silicon electrode. The polysilicon plug 20 provides the electrical connection for the capacitor 40 with an associated FET transistor. In place of polysilicon in this application, a metal plug may also be utilized (e.g. W, Al).

The capacitor 40 broadly stated, includes: a barrier layer 42 formed over the polysilicon plug 20; a lower electrode 44 formed on the barrier layer; spacers 46, 48 formed on the sidewalls of the barrier layer 42 and lower electrode 44; a high dielectric constant dielectric film 50 formed over the lower electrode 44; and an upper electrode formed over the dielectric film 50.

The spacers 46, 48 provide an improved capacitor structure. In particular, the spacers 46, 48 function to prevent oxidation of the sidewalls 58, 60 of the barrier layer 42 during deposition of the dielectric film 50. In addition, the spacers 46, 48 provide an increased surface area for the capacitor 40, and offer a smoother topography prior to dielectric film 50 deposition. This smoothens and contours the geometry of the dielectric layer 50.

Figure 1:
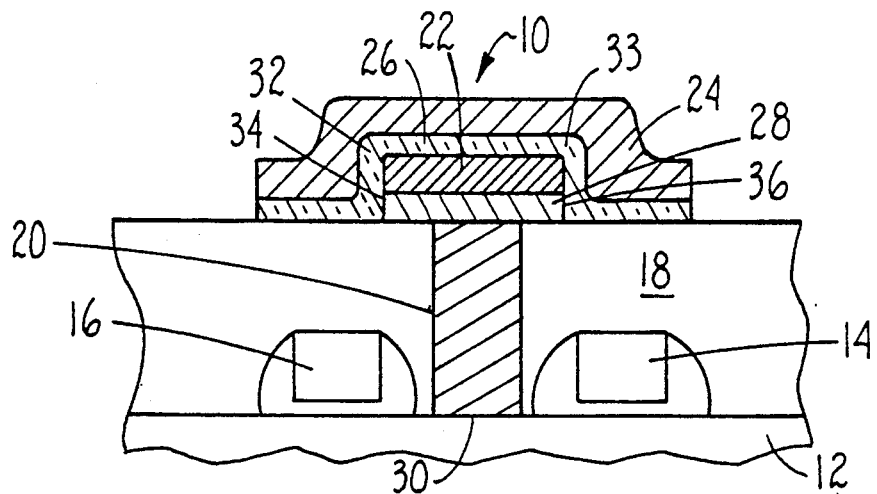
FIG. 1 is a schematic cross sectional view of a prior art thin film high dielectric constant capacitor.

Specifically, a conformal deposition of the dielectric layer 50 over the sidewalls 54, 56 of the lower electrode and the sidewalls 34, 36 of the barrier layer 24, is not required as with the prior art capacitor 10 (FIG. 1). The dielectric layer 50 can thus be formed with a smooth geometry and without sharp corners. The smooth geometry of the dielectric layer helps to prevent the current leakage that may occur with the sharp corners 32, 33 (FIG. 1) of the dielectric layer 26 of the prior art capacitor 10 (FIG. 1).

Further, the spacers 46, 48 provide a larger area for protection of the polysilicon plug 20 during deposition of the dielectric layer 50. With the prior art capacitor 10 (FIG. 1) any misalignment of the barrier layer 28 (FIG. 1) with the polysilicon plug 20 would subject the unprotected portion of the polysilicon plug 20 to oxidation.

The spacers 46, 48 may be formed of either an insulating material or a conducting material. As an example, an insulating material such as an oxide or a nitride would be suitable. The spacers 46, 48 may be formed by deposition (e.g. chemical vapor deposition (CVD), (LPCVD), (PECVD), (MOCVD), sputtering) followed by a dry anisotropic etch. Such a process forms self-aligned spacers without the need of a mask. A preferred method of performing the spacer etch would be in a glow discharge plasma etching system. The gas etchants for such a spacer etch would depend on the spacer material. An additional requirement for a spacer etch is that the spacers 46, 48 be formed of a different material than the lower electrode 44.

Using a spacer etch, the spacers 46, 48 are preferably formed as shown in FIG. 2, with a rounded top surface (i.e. rounded corners) and vertical walls. This provides a suitable geometry for depositing the dielectric layer 50. The dielectric layer 50 can thus also be formed with rounded corners 62, 64. This smooth geometry provides a dielectric layer 50 which is less prone to current leakage at the corners.

Alternately, the spacers 46, 48 may be formed wide enough to completely fill the gap between adjacent storage capacitors (i.e. storage nodes) in a memory array. This would provide a substantially planar surface tot deposition of the dielectric layer 50. Such a planar surface could be formed using a spacer etch as previously described or a (CMP) step to be hereinafter described. In this embodiment the spacers 46, 48 would need to be formed of an insulating material.

A process sequence for forming a capacitor 40 in accordance with the invention would include the following steps:

1. Form the insulating layer 18 on the semiconductor transistor structure. Such an insulating layer is preferably formed of a material such as $SiO_2$ which may be grown or deposited by techniques that are known in the art. Alternately, $Si_3N_4$, or a combination of $SiO_2$ and $Si_3N_4$ could be used to avoid the diffusion of impurities that could appear in the high dielectric constant materials or electrode manufacture.

2. Form the polysilicon plug 20 through a contact hole to the silicon source or drain region 30 of the transistor. This may be done by opening the contacts using a dry etch. The contacts may then be Killed with doped polysilicon and etched back.

3. Form the barrier layer 42 on the polysilicon plug 20. The barrier layer 42 must be a conductive material that can be deposited on polysilicon with good adhesion and with low stress. Suitable materials for the barrier layer 42 would be tantalum and titanium nitride. Other suitable materials include tungsten, and molybdenum and alloys of these metals. Silicides of these metals would also be suitable. Such a thin film barrier layer can be deposited by low temperature sputtering, CVD or MOCVD. The thickness of the barrier layer 42 can be on the order of about 10-500 nm.

4. Form the lower electrode 44 on the barrier layer 42. The lower electrode 44 film material must be a conductive material that is non-oxidizing. As an example, high melting point noble metals such as rhodium, platinum and palladium would be suitable. Other suitable materials include ruthenium (Ru) and ruthenium oxide ($RuO_2$) or any other conducting oxide. The lower electrode 44 can be deposited by CVD, LPCVD, PECVD, MOCVD, sputtering or other suitable deposition techniques. The thickness of the lower electrode 44 can be on the order of about 10-100 nm.

The barrier layer 42 and lower electrode 44 can thus be formed as a stack. This stack can then be patterned and dry etched to form the capacitor storage node. Suitable gas enchants include HBr and compounds of fluorine and chlorine contained in an rf, microwave or dc plasma. As an example, such a plasma can be generated at a power of 100-1000 W, a pressure of 1 to 1000 mTorr and using an inert dilution gas such as Ar.

5. Form the spacers 46, 48 on the sidewalls of the barrier layer 42 and lower electrode 44. The spacers 46, 48 may be either a conducting or an insulating material. As long as the spacers 46, 48 are formed of a material different than the lower electrode 44, a dry etch can be used to pattern and shape the spacers 46, 48. As an example, insulating materials such as an oxide or a nitride would be suitable. The spacers 46, 48 can be deposited by CVD, LPCVD, PECVD, MOCVD or sputtering and then etched back using a spacer etch performed in a dry etch system.

In general, with a dry etch, the spacers 46, 48 can be etched with a rounded top surface 62, 64 as shown in FIG. 2. This provides a smooth topography near the bottom electrode corner for a subsequent deposition of the dielectric layer 50. If a thick enough spacer material is deposited, however, the spacers 46, 48 can be formed to completely fill the gap between adjacent capacitor storage nodes, providing an almost planar surface.

Figure 3:
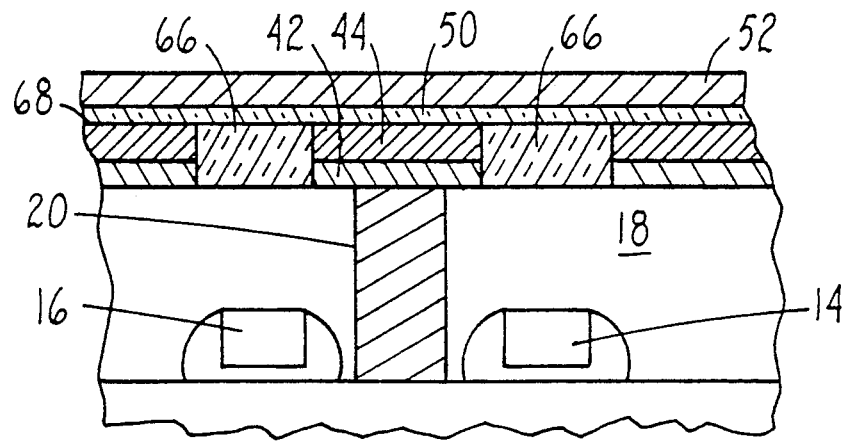
FIG. 3 is a schematic cross sectional view of a thin film high dielectric constant capacitor constructed in accordance with the invention and having planarized spacers formed by a chemical mechanical planarization (CMP) step.

In addition, these gaps can be filled as shown in FIG. 3 using chemical mechanical planarization (CMP). With reference to FIG. 3, a CMP method can be used to form a planar fill 66. With the CMP method, an insulating material such as a silicon nitride or a silicon oxide is deposited over the lower electrode 44, and into the spaces between adjacent capacitors. The insulating material can then be chemically mechanically planarized (CMP) to the endpoint of the lower electrode 50 to form a completely planar surface 68. The dielectric film 50 will thus also be completely planar.

6. Form the dielectric layer 50 by deposition of a high dielectric constant dielectric material. Such a dielectric material, in addition to having a high dielectric constant, must exhibit low leakage current and high reliability for voltage stress. Suitable materials include BaSrTiO$_3$ (BST), BaTiO$_3$, SrTiO$_3$, PbZrO$_3$, PZT, and PLZT or any other inorganic non-metallic oxide. Such materials are known generally as oxide paraelectric or ferroelectric materials. In general, such materials can be deposited by RF-magnetron sputtering at a temperature range of 600° C.–700° C. and under a vacuum. A target material can be prepared of a stoichiometric composition of powder materials. The thickness of such a dielectric layer 50 is preferably in the range of 10nm-250nm. Other deposition techniques such as CVD, LPCVD PECVD or MOCVD can also be utilized. As previously explained the spacers 62, 64 (or planar spacers 66, FIG. 3) provide a smooth topography for deposition of the dielectric material.

7. Form the upper electrode 52 by deposition of a conducting material or the dielectric layer 50. Suitable materials for the upper electrode include TiN and platinum. A suitable deposition process is sputtering or any CVD-based process (CVD, LPCVD, PECVD or MOCVD). As an example, the upper electrode 52 can be formed with a thickness of about 20–200 nm.

Thus the invention provides a novel capacitor structure and a method for forming such a capacitor structure. Although the invention has been described in terms of preferred embodiments, as will be apparent to those skilled in the art, other applications of the inventive concepts disclosed herein are possible. It is intended therefore that the following claims include such alternate embodiments.

What is claimed is:

1. A high dielectric constant stacked storage capacitor for a semiconductor structure, comprising:
   a polysilicon electrode formed in an electrically insulating layer of the semiconductor structure;
   a barrier layer formed of an electrically conductive material deposited on the polysilicon electrode;
   a lower electrode formed of a non-oxidizing electrically conductive material deposited on the barrier layer and etched with the barrier layer to form a stacked structure having sidewalls;
   a pair of spacers covering the sidewalls of the stacked structure formed by depositing a material different than the conductive material for the lower electrode over the lower electrode and the sidewalls and etching said material to provide a rounded and smooth topography and an increased surface area for deposition of a dielectric material;
   dielectric material deposited on the lower electrode and spacers to provide a smooth dielectric layer; and
   an upper electrode formed on the dielectric layer.

2. A stacked capacitor as claimed in claim 1 and wherein the spacers are formed of an electrically insulating material.

3. A stacked capacitor as claimed in claim 1 and wherein the spacers are formed of an electrically conducting material.

4. A stacked capacitor as claimed in claim 1 and wherein the dielectric material is a material selected from the group consisting of $BaSrTiO_3$, $BaTiO_3$, $SrTiO_3$, $PbZrO_3$, PZT, PLZT and any inorganic insulating metal oxide.

5. A high dielectric constant stacked storage capacitor for a semiconductor structure, comprising:
   a polysilicon electrode formed in an electrically insulating layer of the semiconductor structure;
   a barrier layer formed of an electrically conductive material deposited on the polysilicon electrode;
   a lower electrode of a non-oxidizing electrically conductive material deposited on the barrier layer and etched to provide a plurality of stacked structures with gaps therebetween each stacked structure having sidewalls;
   spacers formed of a material different than the conductive material for the lower electrode deposited in the gaps and on the sidewalls to protect the barrier layer from oxidation and having a planarized surface formed by chemical mechanical planarization (CMP) to an endpoint of the lower electrode to provide a smooth and planar surface for deposition of a dielectric layer;
   a dielectric layer formed of a high dielectric constant material deposited on the smooth surface of the lower electrode and spacers; and
   and upper electrode of a conductive material formed on the dielectric layer.

6. A capacitor as claimed in claim 5 and wherein the spacers are formed of a material selected from the group consisting of oxides and nitrides.

7. A capacitor as claimed in claim 5 and wherein the barrier layer is formed of Ta, the lower electrode is formed of Pt, the dielectric material is formed of $BaSrTiO_3$ and the upper electrode is formed of TiN.

8. A method of forming a high dielectric constant capacitor comprising the steps of:
   forming an electrically insulating layer on a semiconductor transistor structure;
   forming a polysilicon electrode in the insulating layer to a silicon electrode layer of the transistor structure;
   forming a barrier layer by depositing an electrically conductive material on the polysilicon electrode;
   forming a lower electrode by depositing a non-oxidizing electrically conductive material on the barrier layer and etching said non-oxidizing conductive material along with said barrier layer to form an array of stacked structures having sidewalls and gaps therebetween;
   depositing a material different than the lower electrode into the gaps and onto the sidewalls and etching said different material to form spacers to protect the barrier layer from oxidation said spacers having a contoured surface to provide an increased surface area and a smooth topography for deposition of a dielectric layer;
   depositing a high dielectric constant film over the smooth topography provided by the lower electrode and spacers; and
   depositing an electrically conductive material on the high dielectric constant film to form an upper electrode.

9. A method of forming a capacitor as claimed in claim 8 and wherein the insulating layer on the semiconductor transistor is selected from the group consisting of $SiO_2$, $Si_3N_4$, and a combination of both.

10. A method of forming a capacitor as claimed in claim 8 and wherein the lower electrode is formed of an electrically conductive oxide.

11. A method of forming a high dielectric constant capacitor comprising the steps of:
   forming an electrically insulating layer on a semiconductor transistor structure;
   forming a polysilicon electrode in the insulating layer to a silicon electrode layer of the transistor structure;
   forming a lower electrode by depositing a non-oxidizing electrically conductive material on the barrier layer and etching said non-oxidizing conductive material along with said barrier layer to form an array of stacked structures having sidewalls and gaps therebetween;
   depositing a material different than the lower electrode to cover the sidewalls and completely fill the gaps and chemically mechanically planarizing said different material to an endpoint of said lower electrode to provide a planar topography for deposition of a dielectric layer and to provide protection for the sidewalls;
   depositing a high dielectric constant film over the planar topography provided by the lower electrode and spacers; and
   depositing a conductive material on the high dielectric constant film to form an upper electrode.

12. A method of forming a capacitor as claimed in claim 11 and wherein the lower electrode is formed of a conductive oxide.

13. A method of forming a capacitor as claimed in claim 11 and wherein the dielectric material is an inorganic metal oxide.

14. A method of forming a capacitor as claimed in claim 11 and wherein the dielectric material is selected from the group consisting of $BaSrTiO_3$, $BaTiO_3$, $SrTiO_3$, $PbZrO_3$, PZT and PLZT.

* * * * *